United States Patent [19]

Yamazaki

[11] Patent Number: 4,498,092
[45] Date of Patent: Feb. 5, 1985

[54] SEMICONDUCTOR PHOTOELECTRIC CONVERSION DEVICE

[75] Inventor: Shunpei Yamazaki, Tokyo, Japan

[73] Assignee: Semiconductor Energy Laboratory Co., Ltd., Japan

[21] Appl. No.: 301,595

[22] Filed: Sep. 14, 1981

[30] Foreign Application Priority Data

Sep. 16, 1980 [JP] Japan .................... 55-128110

[51] Int. Cl.³ ............................. H01L 45/00
[52] U.S. Cl. ................................ 357/2; 357/16; 357/58; 357/59; 136/258
[58] Field of Search ............. 357/2, 59, 58, 91, 16, 357/89

[56] References Cited

U.S. PATENT DOCUMENTS

| | | | |
|---|---|---|---|
| 4,024,558 | 5/1977 | Merrin | 357/2 |
| 4,069,492 | 1/1978 | Pankovis et al. | 357/2 X |
| 4,122,476 | 10/1978 | Hovel et al. | 357/90 X |
| 4,217,374 | 8/1980 | Ovshinsky et al. | 357/2 X |
| 4,224,084 | 9/1980 | Pankove | 357/2 |
| 4,239,554 | 12/1980 | Yamazaki | 357/30 X |
| 4,254,429 | 3/1981 | Yamazaki | 357/59 X |
| 4,272,641 | 6/1981 | Hanak | 357/30 X |
| 4,292,461 | 9/1981 | Hovel | 357/2 |

Primary Examiner—Martin H. Edlow
Attorney, Agent, or Firm—Gerald J. Ferguson, Jr.; Joseph J. Baker

[57] ABSTRACT

A semiconductor device is provided with at least first and second semiconductor regions having defined therebetween a junction. The first semiconductor region or both of the first and second semiconductor regions are each formed of a semiconductor having a structure in which the degree of crystallization varies spatially. In this case, the first and second semiconductor regions have different conductivity types and form therebetween a PN, PI or NI junction; the first and second semiconductor regions have different energy gaps and form therebetween a heterojunction; the first and second semiconductor regions have different energy gaps, the same conductivity type and form therebetween a heterojunction; or the first and second semiconductor regions have the same conductivity type, different impurity concentrations and form therebetween an HL (High-Low) junction.

The semiconductor region having the structure in which the crystallization degree varies spatially is typically formed of a semiconductor which is composed of a mixture of a microcrystalline semiconductor and a non-crystalline semiconductor, the mixture is doped with a dangling bond neutralizer, and the microcrystalline semiconductor has a lattice strain.

7 Claims, 9 Drawing Figures

SEMICONDUCTOR PHOTOELECTRIC CONVERSION DEVICE

BACKGROUND OF THE INVENTION

1. Field of the Invention

The present invention relates to a semiconductor device suitable for use as a photoelectric conversion semiconductor device.

2. Description of the Prior Art

Heretofore there have been proposed a variety of photoelectric conversion semiconductor devices constructed using a single crystal, polycrystalline or non-crystalline semiconductor.

The single crystal semiconductor employed for the photoelectric conversion semiconductor device exhibits a high degree of photoconductivity as compared with the polycrystalline or non-crystalline semiconductor doped with a dangling bond neutralizer when employed for the fabrication of the photoelectric conversion semiconductor device. For example, in the case where the polycrystalline semiconductor is formed of polycrystalline silicon, its photoconductivity is $10^{-5}$ to $10^{-8}$ S.cm$^{-1}$ under AM1 (100 mW/cm$^2$) illumination of the sunlight (The same shall apply hereinafter.) and its dark-conductivity is only $10^{-7}$ to $10^{-12}$ S.cm$^{-12}$ S.cm$^{-1}$. The non-crystalline semiconductor which is formed of amorphous silicon has a photoconductivity as low as $10^{-6}$ to $10^{-8}$ S.cm$^{-1}$ and a dark-conductivity as low as $10^{-8}$ to $10^{-12}$ S.cm$^{-1}$. In contrast thereto, the single crystal semiconductor formed of single crystal silicon has a photoconductivity of $10^{-3}$ S.cm$^{-1}$ or more and a dark-conductivity of $10^{-4}$ to $10^{-6}$ S.cm$^{-1}$.

Accordingly, it can be said that the single crystal semiconductor is excellent in terms of photoconductivity and dark-conductivity as compared with the polycrystalline or non-crystalline semiconductor.

In general, the single crystal semiconductor has a larger diffusion length of minority carriers than the polycrystalline or non-crystalline semiconductor which is doped with a dangling bond neutralizer. For instance, in the case of the non-crystalline semiconductor being formed of amorphous silicon, its diffusion length for minority carriers is only 300 to 400 Å and also in the case of a polycrystalline semiconductor being formed of polycrystalline silicon, its diffusion length of minority carriers is substantially equal to that of the amorphous silicon. In contrast thereto, in the case of the single crystal semiconductor being formed of single crystal silicon, its diffusion length of minority carriers ranges from $10^2$ to $10^4$ $\mu$m.

Accordingly, it can be said that the single crystal semiconductor excels the polycrystalline or non-crystalline semiconductor in the diffusion length of minority carriers.

Furthermore, the single crystal semiconductor usually has a higher impurity ionization rate than the polycrystalline or non-crystalline semiconductor. The impurity ionization rate herein mentioned is a rate in which ions, providing the P or N type conductivity, are generated in the semiconductor when it has been doped with a P or N type impurity. For example, the non-crystalline semiconductor which is formed of amorphous silicon has an impurity ionization rate of approximately 0.1%. In the case of the polycrystalline semiconductor, even if it is doped with a P or N type impurity, the impurity is precipitated on the grain boundary and, consequently, ions which provide the P or N type conductivity are difficult to generate in the semiconductor. In contrast thereto, the single crystal semiconductor which is formed of single crystal silicon has an impurity ionization rate close to 100%.

Accordingly, it can be said that the single crystal semiconductor is excellent in terms of impurity ionization rate as compared with the polycrystalline or non-crystalline semiconductor.

In general, however, the single crystal semiconductor has a smaller optical absorption coefficient than the non-crystalline semiconductor as is the case with the polycrystalline semiconductor. For instance, the non-crystalline semiconductor which is formed of amorphous silicon exhibits optical absorption coefficients of $4\times 10^5$ cm$^{-1}$, $1\times 10^5$ cm$^{-1}$ and $2\times 10^4$ cm$^{-1}$ for lights having wavelengths of 0.4, 0.5 and 0.6 $\mu$m, respectively. In contrast thereto, the single crystal, semiconductor which is formed of a single crystal silicon has optical absorption coefficients of $1\times 10^5$ cm$^{-1}$ $1\times 10^4$ cm$^{-1}$ and $6\times 10^3$ cm$^{-1}$ for light of 0.4, 0.5 and 0.6 $\mu$m wavelength, as in the case with the polycrystalline semiconductor.

Accordingly, it cannot be said that the single crystal semiconductor excels the non-crystalline semiconductor in optical abosrption coefficient.

Moreover, the single crystal semiconductor usually has a smaller energy band gap than the non-crystalline semiconductor doped with a dangling bond neutralizer, as is the case with the polycrystalline semiconductor similarly doped with a neutralizer. For example, in the case where the non-crystalline semiconductor is formed of amorphous silicon, its energy band gap is in the range of 1.7 to 1.9 eV. In contrast therefo, the single crystal semiconductor which is formed of single crystal silicon has an energy band gap of 1.1 eV as in the case where the abovesaid polycrystalline semiconductor is formed of polycrystalline silicon.

Furthermore, in the single crystal semiconductor, transition of electrons is indirect even at low temperatures.

In general, the non-crystalline semiconductor, in particular, an amorphous semiconductor has a larger optical absorption coefficient than the single crystal or polycrystalline semiconductor. For instance, in the case where the non-crystalline semiconductor is formed of amorphous silicon, it exhibits optical absorption coefficients of $4\times 10^5$ cm$^{-1}$, $1\times 10^5$ cm$^{-1}$ and $2\times 10^4$ cm$^{-1}$ for light of 0.4, 0.5 and 0.6 $\mu$m wavelength, as described previously; namely, the non-crystalline semiconductor is far larger in the optical absorption coefficient than the single crystal semiconductor which is formed of single crystal silicon.

Accordingly, it can be said that the non-crystalline, especially, amorphous semiconductor is excellent in optical absorption coefficient, as compared with the single crystal or polycrystalline semiconductor.

Besides, in the case where the non-crystalline, in particular, amorphous semiconductor is doped with the dangling bond neutralizer, it has a larger energy band gap than the single crystal semiconductor and the polycrystalline one doped with the dangling bond neutralizer. For example, the above non-crystalline semiconductor which is formed of amorphous silicon has an energy band gap ranging from 1.7 to 1.9 eV. This energy band gap is larger than the energy band gaps of the single crystal semiconductor formed of single crystal silicon and the polycrystalline semiconductor formed of polycrystalline silicon and doped with the dangling bond neutralizer.

Further, in the non-crystalline, especially, amorphous semiconductor, the transition of electrons is direct at low temperature.

As will be appreciated from the above, the single crystal semiconductor is excellent in terms of the photoconductivity, diffusion length of minority carriers and impurity ionization rate but poor in the optical absorption coefficient; therefore, a photoelectric conversion semiconductor device using this semiconductor is not suitable for use as a light-receiving photoelectric conversion semiconductor device. Further, a photoelectric conversion semiconductor device using the single crystal semiconductor cannot be employed as a light-emitting photoelectric conversion semiconductor device because the transition of electrons in the single crystal semiconductor is indirect.

The non-crystalline semiconductor, especially, the amorphous one, is excellent in the optical absorption coefficient but poor in the photoconductivity, the diffusion length of minority carriers and the impurity ionization rate; accordingly, a photoelectric conversion semiconductor device using this semiconductor is not suitable for use as a light-receiving, photoelectric conversion semiconductor device. In addition, since the non-crystalline or amorphous semiconductor permits direct transition of electrons, it is considered that a photoelectric conversion semiconductor device using this semiconductor can be used as a light-emitting photoelectric conversion semiconductor device, but it cannot be employed because the non-crystalline semiconductor is low in dark-conductivity and impurity ionization rate.

Moreover, a photoelectric conversion semiconductor device using the polycrystalline semiconductor is not suitable at all for use as a light-receiving and a light-emitting photoelectric conversion semiconductor device.

SUMMARY OF THE INVENTION

Accordingly, it is an object of the present invention to provide a novel semiconductor device employing a semiconductor which has excellent optical and electrical properties of both a crystalline semiconductor, in particular, a single crystal one and a non-crystalline semiconductor, in particular, an amorphous one.

The semiconductor device of the present invention is provided with at least first and second semiconductor regions having defined therebetween a junction. The first semiconductor region or both of the first and second semiconductor regions are each formed of a semiconductor having a structure in which the degree of crystallization varies spatially. In this case, the first and second semiconductor regions have different conductivity types and form therebetween a PN, PI or NI junction; the first and second semiconductor regions have different energy gaps and form therebetween a heterojunction; the first and second semiconductor regions have different energy gaps, the same conductivity type and form therebetween a heterojunction; or the first and second semiconductor regions have the same conductivity type, different impurity concentrations and form therebetween an HL (High-Low) junction.

The semiconductor region having the structure in which the crystallization degree varies spatially is typically formed of a semiconductor which is composed of a mixture of a microcrystalline semiconductor and a non-crystalline semiconductor, that the mixture is doped with a dangling bond neutralizer, and that the microcrystalline semiconductor has a lattice strain. In this case, the microcrystalline semiconductor typically has a particle size of 5 to 200 Å and is dispersed in the non-crystalline semiconductor. The dangling bond neutralizer is less than 5 mol% with regard to the mixture. The semiconductor forming such a semiconductor region will hereinafter be referred to as a semi-amorphous semiconductor.

With such a semi-amorphous semiconductor, the presence of the microcrystalline semiconductor and the dangling bond neutralizer provides a high degree of photoconductivity, a high degree of dark-conductivity and a large diffusion length of minority carriers as compared with those of the non-crystalline semiconductor, as is the case with the single crystal semiconductor.

Since the semi-amorphous semiconductor for use in the semiconductor device of the present invention contains the microcrystalline semiconductor, it has a higher impurity ionization rate than the non-crystalline semiconductor as is the case with the single crystal one.

Further, in the semi-amorphous semiconductor for use in the semiconductor device of the present invention, the presence of the non-crystalline semiconductor and the lattice strain of the microcrystalline semiconductor provides a larger optical absorption coefficient than that of the single crystal semiconductor, as in the case of the non-crystalline, particularly, amorphous semiconductor.

Moreover, the semi-amorphous semiconductor for use in the semiconductor device of the present invention has an energy band gap intermediate between those of the single crystal semiconductor and the non-crystalline one because of the presence of the microcrystalline semiconductor, the non-crystalline semiconductor and the lattice strain of the microcrystalline semiconductor.

In the semi-amorphous semiconductor for use in the semiconductor device of the present invention, the transition of electrons is direct because of the presence of the microcrystalline semiconductor, the non-crystalline semiconductor and the lattice strain of the microcrystalline semiconductor.

Thus, the semi-amorphous semiconductor for use in the semiconductor device of the present invention has, in combination, excellent optical and electrical properties in the single crystal semiconductor and the non-crystalline semiconductor, particularly, the amorphous one.

Accordingly, the semiconductor device of the present invention employing the semi-amorphous semiconductor has the advantage that it can be employed not only as a light-receiving, photoelectric conversion semiconductor device but also as a light-emitting one.

DESCRIPTION OF THE PREFERRED EMBODIMENTS

Figure 1:
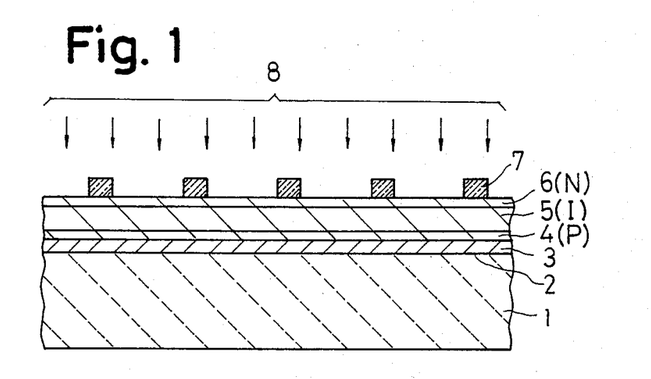
FIG. 1 is a cross-sectional view schematically illustrating an embodiment of the present invention as being applied to a photoelectric conversion semiconductor device.
Figure 2A:
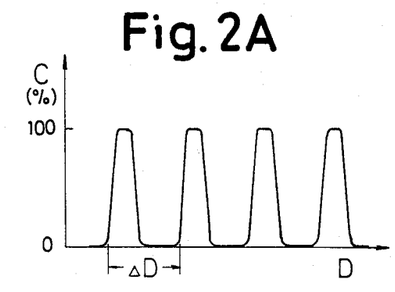
FIG. 2 is a diagram showing the structure of a semiconductor forming each semiconductor region in the embodiment of FIG. 1.
Figure 2B:
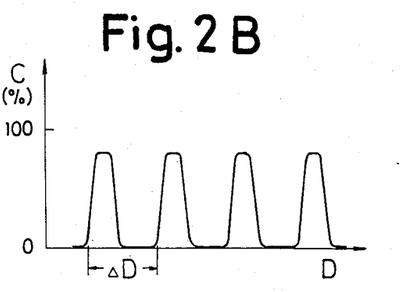
Figure 2C:
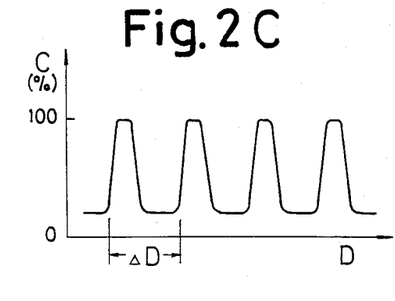
Figure 2D:
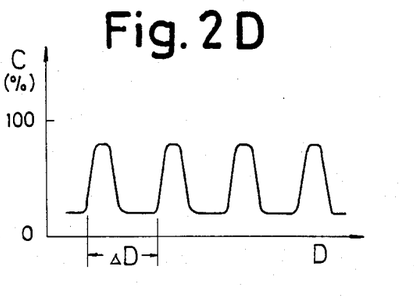

In FIG. 1 there is illustrated a first embodiment of the semiconductor device of the present invention as being applied to a photoelectric conversion semiconductor device. The photoelectric conversion semiconductor device is provided with a substrate 1 having a flat major surface 2. In this embodiment the substrate 1 is formed of an insulator such, for example, as ceramics.

On the major surface 2 of the substrate 1 is formed by a known method a conductive layer 3, which may be formed of metal. The conductive layer 3 is covered with first, second and third semiconductor regions 4, 5 and 6 formed in layers in this order. The first, second and third semiconductor regions 4, 5 and 6 have, for example, P, I (undoped or compensated and hence intrinsic) and N conductivity types, respectively. These semiconductor regions 4, 5 and 6 are formed, for instance, by a method which will be described later with reference to FIG. 4. On the third semiconductor region 6 is mounted a comb-shaped or grid-shaped transparent electrode 7 which makes ohmic contact with the region 6.

The first, second and third semiconductor regions 4, 5 and 6 are each formed of a semiconductor having a structure in which the degree of crystallization C varies spatially with respect to the space co-ordinate D (co-ordinates in directions of the thickness and surface of each region) as shown in FIGS. 2A to 2D. A mean pitch $\Delta D$ of variation in the degree of crystallization in this case ranges from 5 to 500 $A\mathring{A}$ in the direction of the thickness of each region and 50 $A\mathring{A}$ to $10\mu$, in particular, 1000 to 3000 $A\mathring{A}$ in the direction of its surface. A typical semiconductor having the structure in which the degree of crystallization C varies spatially as shown in FIGS. 2A to 2D, is a semiconductor which is formed of a mixture of a microcrystalline semiconductor and a non-crystalline semiconductor and the mixture is doped with a dangling bond neutralizer and the microcrystalline semiconductor has a lattice strain. Such a semiconductor will hereinafter be referred to as a semi-amorphous semiconductor.

According to an embodiment of the semi-amorphous semiconductor, the microcrystalline semiconductor and the non-crystalline semiconductor are both, for example, silicon; in this case, the mixture is normally silicon and the microcrystalline semiconductor is dispersed in the non-crystalline semiconductor. The dangling bond neutralizer is composed of hydrogen or a halogen such as fluoride or chlorine and the mixture is doped with such a dangling bond neutralizer in an amount of less than 5 mol% relative to the former. The microcrystalline semiconductor is 5 to 200 $A\mathring{A}$ in particle size and has an appropriate lattice strain.

In the case of the abovesaid embodiment, the semiamorphous semiconductor has a dark conductivity of $1 \times 10^{-4}$ to $1 \times 10^{-6}$ S.cm$^{-1}$ and a photoconductivity higher than $1 \times 10^{-3}$ S.cm$^{-1}$ under AM1 illumination. According to my experiments, one sample had a dark conductivity of $6.7 \times 10^{-5}$ S.cm$^{-1}$ and a photoconductivity of $2.8 \times 10^{-3}$ S.cm$^{-1}$; another sample had a dark conductivity of $3.3 \times 10^{-4}$ S.cm$^{-1}$ and a photoconductivity of $1.4 \times 10^{-3}$ S.cm$^{-1}$; and still another sample had a dark conductivity of $8.0 \times 10^{-4}$ S.cm$^{-1}$ and a photoconductivity of $2.7 \times 10^{-3}$ S.cm$^{-1}$.

The semi-amorphous semiconductor of the above embodiment has a diffusion length of minority carriers ranging from 0.5 to 100 $\mu$m. In one of the samples obtained by my experiments, the diffusion length of minority carriers was 10.5 $\mu$m.

Further, the above semi-amorphous semiconductor has an impurity ionization rate higher than 99%. One of the samples experimentally produced had an impurity ionization rate of 99.2%.

Moreover, the above semi-amorphous semiconductor exhibits optical absorption coefficient higher than $3.5 \times 10^5$, $8.5 \times 10^4$ and $1.5 \times 10^4$ cm$^{-1}$ for light with 0.4, 0.5 and 0.6 $\mu$m wavelength, respectively. One of the samples experimentally produced exhibited optical absorption coefficients of $4 \times 10^5$, $1.5 \times 10^5$ and $3 \times 10^4$ cm$^{-1}$ for the lights of the abovesaid wavelengths, respectively.

Besides, the above semi-amorphous semiconductor has an energy band gap in the range of 1.4 to 1.7 eV. In one of the abovesaid samples, the energy band gap was 1.6 eV.

In the above semi-amorphous semiconductor, the transition of electrons is a direct one at low temperatures.

According to the above embodiment of the semi-amorphous semiconductor forming the first, second and third semiconductor regions 4, 5 and 6, the dark-conductivity and the photoconductivity are higher than those of the semiconductor formed of non-crystalline silicon, in particular, amorphous silicon, as is the case with the semiconductor formed of single crystal silicon. The diffusion length of minority carriers is larger than that of the semiconductor formed of the amorphous silicon, as is the case with the semiconductor of single crystal silicon. Further, the impurity ionization rate is higher than that of the semiconductor formed of the amorphous silicon, as in the case of the semiconductor formed of the single crystal silicon. The optional absorption coefficient is larger than that of the semiconductor formed of the single crystal silicon, as in the case of the semiconductor formed of the amorphous silicon. The energy band gap has a value intermediate between the energy band gaps of the semiconductor formed of the single crystal silicon and the semiconductor formed of the amorphous silicon.

The above means that the semi-amorphous semiconductor forming each of the first, second and third semiconductor regions 4, 5 and 6 has the excellent properties of both the semiconductor formed of the single crystal silicon and the semiconductor formed of the amorphous silicon.

The reason for which such excellent properties are provided is that the semi-amorphous semiconductor forming each of the first, second and third semiconductor regions 4, 5 and 6 has a mechanism different from those of the semiconductors formed of the single crystal silicon and the amorphous silicon doped with the dangling bond neutralizer. This has been confirmed by an electron rays diffraction photograph. In the electron rays diffraction photograph, a spot pattern produced in he case of only the single crystal silicon, a ring pattern produced in the case of only the polycrystalline silicon and halos produced in the case of only the amorphous silicon were seen.

The fact that the semi-amorphous semiconductor according to the above embodiment has a structure different from that of the semiconductor formed of the amorphous silicon and doped with the dangling bond neutralizer can be understood from the fact that although containing the neutralizer in an amount of only less than 5 mol%, the former greatly excels the latter in the photoconductivity, the dark-conductivity and the diffusion length of minority carriers. By the way, the semiconductor of amorphous silicon doped with the dangling bond neutralizer requires doping of the neutralizer in an amount of at least 20 to 30 mol% with regard to the amorphous silicon. The reason for which the amount of dangling bond neutralizer doped in the semi-amorphous semiconductor is smaller than in the case of the abovesaid amorphous silicon is that dangling bonds in the non-crystalline semiconductor are neutralized by the microcrystalline semiconductor.

Figure 3:
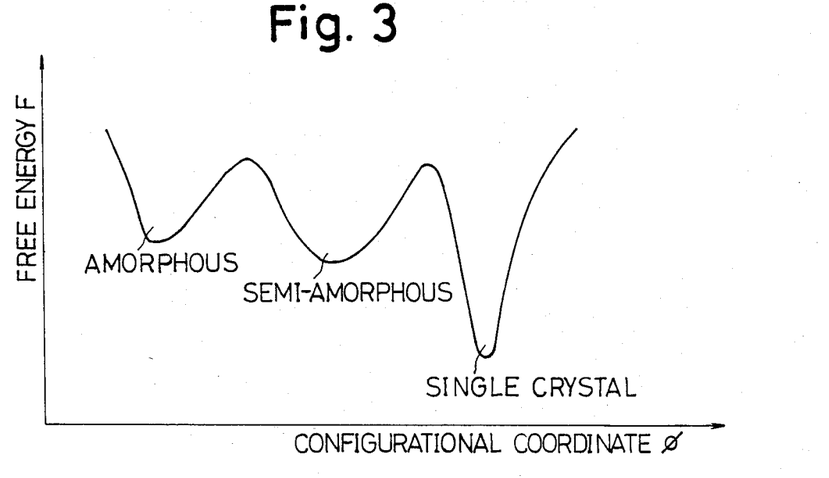
FIG. 3 is a graph showing the relationships of the semi-amorphous semiconductor for use in the present invention to amorphous and single crystal semiconductors.

Further, the reason for which the semi-amorphous semiconductor forming each of the first, second and third semiconductor regions 4, 5 and 6 has the aforementioned excellent properties as the photoelectric conversion semiconductor is that the semi-amorphous semconductor of the present invention has stable states as is the case with the single crystal semiconductor and the semiconductor formed of the amorphous semiconductor, as shown in FIG. 3 which shows the relationship between the configurational coordinate $\phi$ on the abscissa and the free energy F on the ordinate.

As will be evident from the above, the semi-amorphous semiconductor forming each of the first, second and third semiconductor regions 4, 5 and 6 is excellent in the photoconductivity, the diffusion length of minority carriers, the impurity ionization rate and the optical absorption coefficient. Especially, in the case where the mixture is formed of silicon as in the aforesaid embodiment, since the energy band gap is 1.6 eV, the semiconductor device is of particular utility for receiving the sunlight. Further, the semi-amorphous semiconductor forming the first, second and third semiconductor regions 4, 5 and 6 has a high photoconductivity and a large optical absorption coefficient, so that even if the semiconductor regions 4, 5 and 6 are each formed in thin layer, an excellent photoelectric function can be obtained. This means that each of the semiconductor regions 4, 5 and 6 with an excellent photoelectric conversion function can be formed by a small amount of material.

Moreover, the semi-amorphous semiconductor forming the semiconductor regions 4, 5 and 6 permits direct transition of electrons at low temperatures and, further, has high dark-conductivity and impurity ionization rate.

While in the foregoing the microcrystalline semiconductor and the non-crystalline semiconductor forming the mixture and each silicon, the aforementioned excellent properties can equally be obtained in the cases where the both semiconductors are each germanium, a silicon and additional semiconductor material compound expressed by $Si_3N_{4-x}$ ($0<x<4$), $SiO_{2-x}$ ($0<x<2$), $SiC_x$ ($0<x<1$) or $Si_xGe_{1-x}$ ($0<x<1$) and the III–V Group compound semiconductor such as GaAs, PB, InP or the like.

The first, second and third semiconductor regions 4, 5 and 6 formed using the abovesaid semi-amorphous semiconductor can be formed by a method described hereinbelow.

Figure 4:
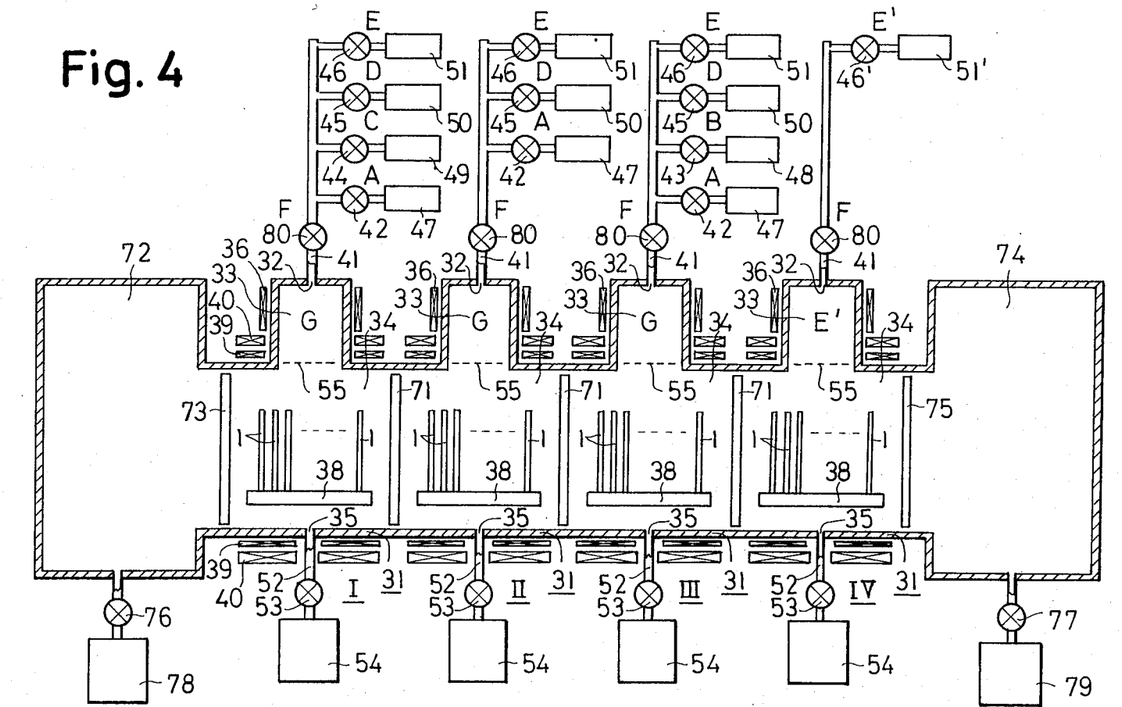
FIG. 4 is a diagram showing a method of forming the semiconductor region and apparatus employed therfor.

FIG. 4 illustrates an embodiment of a method of forming the semiconductor regions 4, 5 and 6 and an arrangement therefor, in which four reaction chambers 31 are employed. The four reaction chambers 31 are formed as a unitary structure with one another in such a manner that they intercommunicate, with a shutter 71 interposed therebetween and the reaction chambers respectively form reaction parts I, II, III and IV.

The reaction chambers 31 each have a gas inlet 32, a gas ionizing region 33, semiconductor depositing region 34, and a gas outlet 35 which are provided in this order. The gas ionizing region has a smaller effective cross-section than the semiconductor depositing region 34. Arranged around the gas ionizing region 33 is an ionizing high-frequency power source 36 which applies to the gas ionizing region 33 an ionizing high-frequency electromagnetic field of, for example, as 1 to 10 GHz, preferably 2.46 GHz. The high-frequency power source 36 may be formed by a coil which is supplied with a high-frequency current.

Disposed around the semiconductor depositing region 34 of each reaction chamber 31 is an orientating-accelerating high-frequency power source 39 which applies to the semiconductor depositing region 34 an orientating-accelerating electric field perpendicularly to the surfaces of the substrates 1. The electric field has a relatively low alternating frequency, for example, 1 to 100 MHz, preferably 13.6 MHz. The high-frequency power source 39 may be formed by a coil which is supplied with a high-frequency current. The high-frequency power source 39 is covered with a heating source 40 which heats the semiconductor depositing region 34 and consequently the substrates 1. The heating source 40 may be a heater which is supplied with a direct current.

To the gas inlet 32 of the reaction chamber 31 of the reaction part I is connected one end of a mixture gas supply pipe 41, to which are connected a main semiconductor material compound gas source 47, a P type impurity compound gas source 49, an additional semiconductor material compound gas source 50 and a carrier gas source 51 through control valves 42, 44, 45 and 46, respectively.

The gas inlet 32 of the reaction chamber 31 of each of the reaction parts II and III has also connected thereto a mixture gas supply pipe 41 similar to that connected with the gas inlet 32 of the reaction part I and the mixture gas supply pipe 41 has connected thereto gas sources similar to those in the case of the reaction part I.

In this case, the gas sources for the reaction part II do not include the P type impurity compound gas source 49; and the gas sources for the reaction part III do not include the P type impurity compound gas source 49 but include an N type impurity compound gas source 48. The gas source for the reaction part IV is only the carrier gas source 51' from which is available a carrier gas E' consisting of one or more of helium, neon and hydrogen gases.

From the main semiconductor material compound gas sources 47 of each of the reaction parts I, II, III and IV is supplied a main-semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride (SiCl4) gas, a silicon tetrafluoride (SiF4) gas or the like. From the P type impurity compound gas source 49 of the reaction part I is supplied a P type impurity compound gas C such as a P type impurity hydride gas, a P type impurity hydroxide gas, a P type impurity halide gas or the like. The P type impurity compound gas C is, for example a hydride, hydroxide or halide gas of boron, aluminum, gallium, indium, selenium or the like. For instance, a diborane ($B_2H_6$) gas is supplied from the P type impurity compound gas source 49. Fron the N type impurity compound gas source 48 of the reaction part III is supplied an N type impurity compound gas B such as an N type impurity hydride gas, an N type impurity halide gas, N type impurity hydroxide gas or the like, for example, a hydride, halide or hydroxide gas of nigrogen, phosphorus, arsenic, antimony, tellurium, selenium or the like. The N type impurity compound gas B is, for example, a phosphine ($PH_3$) gas, an arsine ($AsH_3$) gas or the like. From the additional semiconductor material compound gas source 50 of each of the reaction parts I, II, III and IV is supplied an additional semiconductor material compound gas D such as an additional semiconductor material hydroxide or halide gas of nitrogen, germanium, carbon, tin, lead or the like, for example, an $SnCl_2$, $SnCl_4$, $Sn(OH)_2$, $Sn(OH)_4$, $GeCl_4$, $CCl_4$, $NCl_3$, $PbC_2$, $PbCl_4$, $Pg(0H)_2$, $Pb(OH)_4$ or like gas. From the carrier gas source 51 of each of the reaction parts I, II and III is supplied a carrier gas E which is a gas composed of or contains a helium (He) and/or neon (Ne) gas, for example, a gas composed of the helium gas, a neon gas, or a mixer gas of the helium gas or the neon gas and a hydrogen gas.

To the gas outlet 35 of the reaction chamber 31 of each reaction part is connected one end of a gas outlet pipe 52, which is connected at the other end to an exhauster 54 through a control valve 53. The exhaust 54 may be a vacuum pump which evacuate the gas in the reaction chamber 31 through the control valve 53 and the gas outlet tube 52.

It is preferred that a gas homogenizer 55 is provided midway between the gas ionizing region 33 and the semiconductor depositing region 34 in the reaction chamber 31 of each reaction part.

Each mixture gas supply pipe 41 has a control valve 80 on the side of the reaction part. The reaction part I communicates, on the opposite side from the reaction part II, with a chamber 72, with a shutter 73 interposed therebetween. The chamber 72 is provided for inserting into the semiconductor depositing region 34 of the reaction part 1 a boat 38 having planted thereon the substrates 1 to be deposited with the semiconductor regions 4, 5 and 6. The reaction part IV communicates, on the opposite side from the reaction part III, with a chamber 74, with a shutter 75 interposed therebetween. The chamber 74 is provided for taking out from the semiconductor depositing region 34 the boat 38 having planted thereon the substrates 1 deposited with the semiconductor regions 4, 5 and 6. The chambers 72 and 74 have connected thereto respectively via control valves 76 and 77 exhausters 78 and 79 similar to the aforesaid one 54.

The boat 38 having planted thereon the substrates 1, which is placed beforehand in the chamber 72 evacuated by the exhauster 78, is inserted into the semiconductor depositing region 34 of the reaction part I, opening the shutter 73. The insertion of the boat 38 is carried out in such a state in which the reaction part I is entirely evacuated or only the carrier gas E flows into the reaction part I. Then, in the semiconductor depositing region 34 a P type, semiconductor region 4 is deposited on each substrate 1 in the manner described hereinbelow.

As described above, the substrate 1 is placed in the semiconductor depositing region 34 of the reaction chamber 31 of the reaction part I and, in the state in which the gas in the reaction chamber 31 is exhausted by the exhauster 54 through the gas outlet 35, the gas outlet pipe 52 and the control valve 53, a mixture gas F containing at least the main semiconductor material compound gas A available from the main semiconductor material compound gas source 47 via the control valve 42 and the carrier gas E available from the carrier gas source 51 via the control valve 46 is introduced into the gas ionizing region 33 of the reaction chamber 31 via the gas inlet 32. In this case, the mixture gas F contains the P type impurity compound gas C available from the P type impurity compound gas source 49 via the control valve 44. Further, the mixture gas F also contains the additional semiconductor material compound gas D available from the additional semiconductor material compound gas source 50 via the control valve 45. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 36 to the mixture gas F introdduced into the gas ionizing region 33, by which the mixture gas F is ionized into a plasma, thus forming a mixture gas plasma G in the gas ionizing region 33. In this case, the high-frequency electromagnetic field may be one that has a 10 to 300 W high-frequency energy having a frequency of 1 to 100 GHz, for example, 2.46 GHz.

Since the electromagnetic field employed for ionizing the mixture gas F into the mixture gas plasma G in the gas ionizing region 33 is a micro-wave electromagnetic field and has such a high frequency as mentioned above, the ratio of ionizing the mixture gas F into the mixture gas plasma G is high. The mixture gas plasma G contain at least a carrier gas plasma into which the carrier gas contained in the mixture gas F is ionized and a main semiconductor material compound gas plasma into which the semiconductor compound gas is ionized. Since the carrier gas contained in the mixture gas F is a gas composed of or containing the helim gas and/or the neon gas, it has a high ionizing energy. For example, the helium gas has an ionizing energy of 24.57 eV and the neon gas an ionizing energy of 21.59 eV. In contrast thereto, hydrogen and argon employed as the carrier gas in the conventional method have an ionizing energy of only 10 to 15 eV. Consequently, the carrier gas plasma contained in the mixture gas plasma has a large energy. Therefore, the carrier gas plasma promotes the ionization of the semiconductor material compound gas contained in the mixture gas F. Accordingly, the ratio of ionizing the semiconductor material compound gas contained in the mixture gas into the semiconductor material compound gas plasma is high.

Consequently, the flow rate of the semiconductor material compound gas plasma contained in the mixture gas plasma G formed in the gas ionizing region 33 is high relative to the flow rate of the entire gas in the gas ionizing region 33.

The same is true of the case where the additional semiconductor material compound gas D to P type impurity compound gas C is contained in the mixture gas F and ionized into its gas plasma.

The mixture gas plasma G thus formed is flowed into the semiconductor depositing region 34 through the gas homogenizer 55 by exhausting the gas in the reaction chamber 31 by means of the exhauster 54 through the gas outlet 35, the gas outlet pipe 52 and the control valve 53.

By flowing the mixture gas plasma G into the semiconductor depositing region 34, semiconductor material is deposited on the substrate 1 placed in the semiconductor depositing region 34. In this case, the flow rate of the mixture gas F introduced into the reaction chamber 31, especially the flow rate of the carrier gas E contained in the mixture gas F is controlled beforehand by the adjustment of the control valve 46 and the flow rate of the gas exhausted from the reaction chamber 31 through the gas outlet 35 is controlled in advance by adjustment of the control valve 53, by which the atmospheric pressure in the reaction chamber 31 is held below 1 atm. Moreover, the substrate 1 is maintained at a relatively low temperature under a temperature at which semiconductor layers deposited on the substrates become crystallized, for example, in the range from the room temperature to 700° C. In the case of maintaining the substrate 1 at room temperature, the heating source 40 need not be used, but in the case of holding the substrate 1 at a temperature higher than the room temperature, the heating source 40 is used to heat the substrate 1. Furthermore, the deposition of the semiconductor material on the substrate 1 is promoted by the orientating electric field established by the orientating-accelerating high-frequency source 39 in a direction perpendicular to the surfaces of the substrate 1.

As described above, by deposing the semiconductor material on the substrate 1 in the semiconductor depositing region 34 in the state in which the atmospheric pressure in the reaction chamber 31 is held low and the substrate 1 is held at a relatively low temperature, a desired first semiconductor region 4 which is formed of a mixture of a microcrystalline semiconductor and a non-crystalline semiconductor and in which the mixture is doped with a dangling bond neutralizer is formed on the substrate 1. The semiconductor region 4 has a P type layer.

In this case, the mixture gas plasma in the semiconductor depositing region 34 is the mixture plasma having flowed thereinto from the gas ionizing region 33, and hence is substantially homogeneous in the semiconductor depositing region 34. Consequently, the mixture gas plasma is substantially homogeneous over the entire surface of the substrate 1.

Accordingly, it is possible to obtain on the substrate 1 the semiconductor region 4 which is homogeneous in the direction of its surface and has substantially no or a negligibly small number of voids.

In addition, since the flow rate of the semiconductor material compound gas plasma contained in the mixture gas plasma G formed in the gas ionizing region 33 is large with respect to the flow rate of the entire gas in the gas ionizing region 33, as mentioned previously, the flow rate of the semiconductor material compound gas plasma contained in the mixture gas on the surface of the substrate 1 in the semiconductor depositing region 34 is also large relative to the flow rate of the entire gas on the surface of the substrate 1. This ensures that the semiconductor region 4 deposited on the surface of the substrate 1 has substantially no or a negligibly small number of voids and is homogeneous in the direction of the surface of the substrate 1.

Besides, since the carrier gas plasma contained in the mixture gas plasma formed in the gas ionizing region 33 has a large ionizing energy, as referred to previously, the energy of the carrier gas plasma has a large value when and after the mixture gas plasma flows into the semiconductor depositing region 34, and consequently the energy of the semiconductor material compound gas plasma contained in the mixture plasma on the substrate 1 in the semiconductor depositing region 34 has a large value. Accordingly, the semiconductor region 4 can be deposited on the substrate 1 with high density.

Furthermore, the carrier gas plasma contained in the mixture gas plasma is composed of or includes the helium gas plasma and/or the neon gas plasma, and hence has a high thermal conductivity. Incidentally, the helium gas plasma has a thermal conductivity of 0.123 Kcal/mHg° C. and the neon gas plasma 0.0398 Kcal/mHg° C. Accordingly, the carrier gas plasma greatly contributes to the provision of a uniform temperature distribution over the entire surface of the substrate 1. In consequence, the semiconductor region 4 deposited on the substrate 1 can be made homogeneous in the direction of its surface.

Moreover, since the carrier gas plasma contained in the mixture gas in the semiconductor depositing region 34 is a gas plasma composed of or containing the helium gas plasma and/or the neon gas plasma, the helium gas plasma is free to move in the semiconductor region 4 formed on the substrate 1. This reduces the density of recombination centers which tends to be formed in the semiconductor region 4, ensuring to enhance its property.

After forming the P type semi-amorphous semiconductor region 4 on the substrate 1 as described above, the boat 38 carrying the substrate 1 respectively deposited with the P type semiconductor region 4 is inserted into the semiconductor depositing region 34 of the reaction part II, with the shutter 71 opened. This insertion of the boat 38 is carried out in such a state in which the reaction parts I and II are entirely evacuated or only the carrier gas E flows therein. In the semiconductor depositing region 34 an I type semi-amorphous semiconductor region 5 is formed on the P type semiconductor region of each substrate 1 in the same manner as described above.

Following this, the boat 38 carrying the substrates 1, each having formed thereon the P type semi-amorphous semiconductor region 4 and the I-type semi-amorphous semiconductor region 5 in this order, is inserted from the reaction part II into the semiconductor depositing region 34 of the reaction part III, with the shutter 71 opened. Also in this case, the boat 38 is inserted into the reaction part III in such a state in which the reaction parts II and III are entirely evacuated or only the carrier gas E flows therein. In the semiconductor depositing region 34 of the reaction part III an N type semi-amrophous semiconductor region 6 is deposited on the I type semi-amorphous semiconductor region 5 of each substrate 1 in the same manner as described above.

Then, the boat 38 which carries the substrates 1, each having formed thereon the P type, I type and N type semi-amorphous semiconductor regions 4, 5 and 6 in this order, is inserted from the reaction part III into the semiconductor depositing region 34 of the reaction part IV, with the shutter 71 opened. In this case, the boat 38 is inserted into the reaction part IV in such a state in which the reaction parts III and IV are entirely evacuated or only the carrier gases E' are passed thereinto. In the semiconductor depositing region 34 of the reaction part IV the P, I and N type semi-amorphous semiconductor regions 4, 5 and 6 formed on each substrate 1 are annealed by a carrier gas plasma into which the carrier gas E' is ionized in the gas ionizing region 33.

Thereafter, the boat 38 carrying the substrates 1, each deposited with the P, I and N type semi-amorphous semiconductor regions 4, 5 and 6, is inserted into the chamber 74 from the reaction part IV, with the shutter 75 opened. In this case, the reaction part IV is entirely evacuated or only the carrier gas E is passed thereinto.

Then, the substrates 1 having thus deposited thereon the P, I and N type semi-amorphous semiconductor regions 4, 5 and 6 are taken out from the chamber 74.

The above has clarified an example of the method for the formation of the semi-amorphous semiconductor regions 4, 5 and 6. With the above-described method, each of the semi-amorphous semiconductor regions 4, 5 and 6 can be formed containing a dangling bond neutralizer in an amount of less than 5 mol% relative to the semiconductor. Further, each of the semi-amrophous semiconductor regions 4, 5 and 6 can be formed by a microcrystalline semiconductor of a particle size ranging from 5 to 200 Å and equipped with an appropriate lattice strain. Moreover, each of the semi-amorphous semiconductor regions 4, 5 and 6 has a dark conductivity of $1\times10^{-4}$ to $1\times10^{-6}$ S.cm$^{-1}$ and a photoconductivity of higher than $1\times10^{-3}$ S.cm$^{-1}$ under AM1 illumination. Besides, the diffusion length of the minority carriers in each of the semi-amorphous semiconductor regions 4, 5 and 6 is 0.5 to 100 $\mu$m, and each semi-amrophous semiconductor region has an impurity ionization rate of more than 99%. In addition, the semi-amorphous semiconductor regions 4, 5 and 6 each exhibit optical absorption coefficients of $3.5\times10^5$, $8.5\times10^4$ and $1.5\times10^4$ cm$^{-1}$ or more for lights having wavelengths of 0.4, 0.5 and 0.6 $\mu$m, respectively, and each semi-amorphous semiconductor region has an energy band gap in the range of 1.4 to 1.7 eV. Furthermore, each semi-amorphous semiconductor region produced by the above-described method permits direct transition of electrons at low temperatures.

And each semi-amorphous semiconductor region assumes stable states as compared with the single crystal semiconductor and the amorphous semiconductor, as shown in FIG. 3 which shows the relationship between the configurational coordinate $\phi$ on the abscissa and the free energy F on the ordinate.

The foregoing has clarified the construction of a first embodiment of the photoelectric conversion semiconductor device according to the present invention.

The apparent construction of the above-described first embodiment is identical with the construction of a conventional PIN type photoelectric conversion semiconductor device formed using a single crystal semiconductor and a polycrystalline or amorphous semiconductor. Accordingly, though not described in detail, when light 8 is incident to the photoelectric conversion semiconductor device on the opposite side from the substrate 1, an electrical output corresponding to the intensity of the incident light 8 is produced across the electrodes 3 and 7 by virtue of the same mechanism as in the case of the prior art PIN type photoelectric conversion semiconductor device.

In the photoelectric conversion semiconductor device according to the present invention, however, the first, second and third semiconductor regions 4, 5 and 6 forming the P, I and N type regions are each formed of the previously-defined semi-amorphous semiconductor possessing the aforesaid excellent optical and electrical properties. Therefore, the photoelectric conversion semiconductor device embodying the present invention exhibit an excellent photoelectric conversion characteristic as compared with the conventional PIN type photoelectric conversion semiconductor device. The photoelectric conversion efficiency of the photoelectric conversion semiconductor device according to the present invention is 7 to 10%, which is three to five times higher than the photoelectric conversion efficiency obtainable with the conventional PIN type photoelectric conversion semiconductor device. According to my experiments, such a high photoelectric conversion efficiency could be obtained with a total thickness of 1 to 5 $\mu$m of the semiconductor regions 4, 5 and 6, which thickness is 1/10 to 1/30 of the total thickness of the semiconductor regions in the conventional PIN photoelectric conversion semiconductor device using the single crystal semiconductor.

Figure 5:
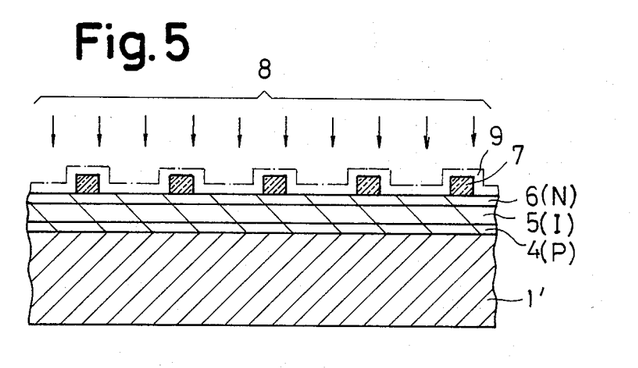
FIGS. 5 to 9 are cross-sectional views illustraing other embodiments of the present invention as being applied to photoelectric conversion semiconductor devices.

FIG. 5 illustrates a second embodiment of the photoelectric conversion semiconductor device according to the present invention. The parts corresponding to those in FIG. 1 are marked with the same reference numerals and no detailed description will be repeated in connection with them. This embodiment has the same PIN type construction as that in FIG. 1 except that the substrate 1 in FIG. 1 is replaced with a conductive substrate 1' formed of a conductive material such, for example, as stainless steel, that the electrode 3 in FIG. 1 is omitted, and that an anti-reflection film 9 as of silicon nitride is deposited on the semiconductor region 6.

With the photoelectric conversion semiconductor device shown in FIG. 5, since it has the same PIN type structure as in the case of FIG. 1 except in the abovesaid point, an electrical output corresponding to the intensity of the incident light 8 is yielded across the conductive substrate 1' and the electrode 7 as is the case with FIG. 1. Further, since the semiconductor regions 4, 5 and 6 constituting the P, I and N type regions, respectively, are each formed of the semi-amorphous semiconductor having the excellent optical and electrical properties, the embodiment of FIG. 5 also presents the same excellent photoelectric conversion characteristic as is obtainable in the case of FIG. 1.

Figure 6:
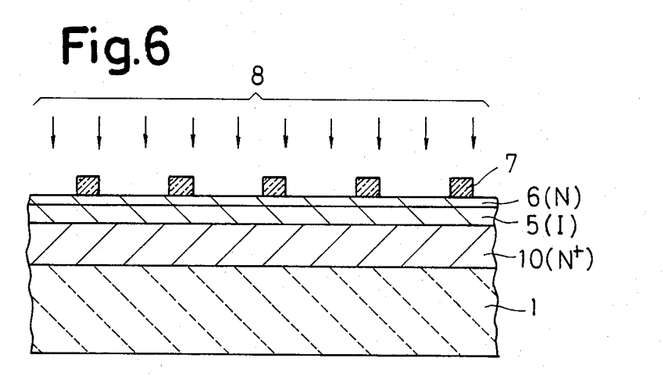

FIG. 6 shows a third embodiment of the photoelectric conversion semiconductor device according to the present invention. In FIG. 6 the parts corresponding to those in FIG. 1 are identified by the same reference numerals and no detailed description will be given of them. This embodiment is identical in construction with the device of FIG. 1 except that the semiconductor region 4 formed of the semi-amorphous semiconductor in FIG. 1 is replaced with an P+ type semiconductor region 10 formed of an amorphous or polycrystalline semiconductor other than the semi-amorphous semiconductor, and that the electrode 3 used in FIG. 1 is omitted.

With the photoelectric conversion semiconductor device of FIG. 6, since it has the same PIN type construction as that in FIG. 1, there is produced across the semiconductor region 10 and the electrode 7 an electrical output corresponding to the intensity of the incident light 8 in the same manner as in the case of FIG. 1. Further, since the semiconductor regions 5 and 6 constituting the N and I type regions, respectively, are each formed of the semi-amorphous semiconductor having the excellent optical and electrical properties, there can be obtained an excellent photoelectric conversion characteristic as compared with the conventional PIN type photoelectric conversion semiconductor device using the single crystal, polycrystalline or amorphous semiconductor.

Figure 7:
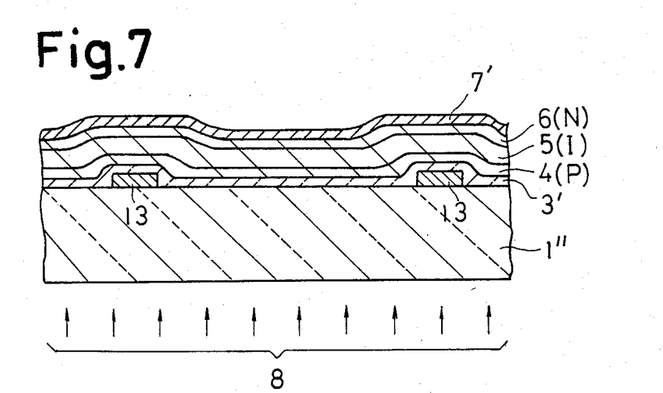

FIG. 7 illustrates a fourth embodiment of the photoelectric conversion semiconductor device according to the present invention. In FIG. 7 the parts corresponding to those in FIG. 1 are identified by the same reference numerals and no detailed description will be repeated in respect of them. This embodiment has the same PIN type structure as in the case of FIG. 1 except that the substrate 1 in FIG. 1 is replaced with a substrate 1″ formed of a transparent and insulating material such as glass, that the electrode 3 in FIG. 1 is replaced with an electrode 3′ formed of a transparent material such as indium-tin oxide, that the electrode 7 in FIG. 1 is replaced with an electrode 7′ of a suitable material which is deposited over the entire area of the semiconductor region 6, and that an electrode 13 as of chromium is disposed between the substrate 1″ and the electrode 3′ for external connection of the latter.

With the photoelectric conversion semiconductor device of FIG. 7, as it has the same PIN structure as in FIG. 1 except in the abovesaid points, there can be obtained across the electrodes 7′ and 13 an electrical output corresponding to the intensity of the incident light 8 on the side of the substrate 1″. Moreover, since the semiconductor regions 4, 5 and 6 constituting the P, I and N type regions, respectively, are each formed of the semi-amorphous semiconductor having the aforementioned excellent optical and electrical properties, there can be obtained the same excellent photoelectric conversion characteristic as is obtainable in FIG. 1.

Figure 8:
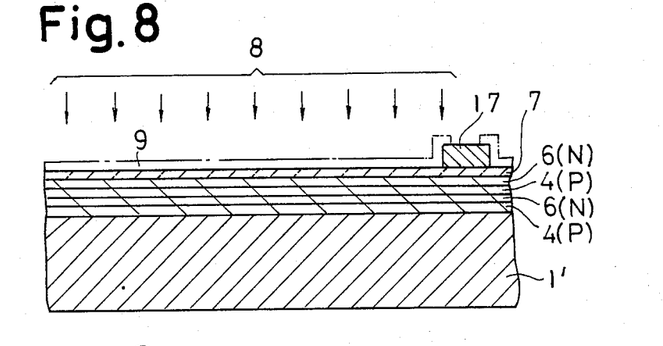

FIG. 8 illustrates a fifth embodiment of the photoelectric conversion semiconductor device according to the present invention. In FIG. 8 the parts corresponding those in FIG. 5 are identified by the same reference numerals and no detailed description will be repeated with regard to them. This embodiment is identical in construction with the device of FIG. 5 except that the semiconductor region 5 forming the I type region in FIG. 5 is omitted, that the semiconductor regions 4 and 5 constituting the P and N type regions, respectively, are disposed alternately with each other to provide a PNPN type structure, that the electrode 7 is deposited all over the outer semiconductor region 6, and that an electrode 17 is formed on the electrode 7 for external connection of the latter.

The apparent construction of the photoelectric conversion semiconductor device shown in FIG. 8 is the same as the construction of a conventional PNPN type photoelectric conversion semiconductor device employing the single crystal, polycrystalline or amorphous semiconductor. Accordingly, when the light 8 is incident to the device on the opposite side from the substrate 1′, an electrical output corresponding to the intensity of the incident light 8 is produced across the electrode 17 and the substrate 1′ by virtue of the same mechanism as in the case of the prior art PNPN photoelectric conversion semiconductor device, though not described in detail.

In the photoelectric conversion semiconductor device of FIG. 8 according to the present invention, however, since the semiconductor regions 4 and 6 constituting the P and N type regions, respectively, are each formed of the semi-amorphous semiconductor having the aforesaid excellent optical and electrical properties, there can be obtained an excellent photoelectric conversion characteristic as compared with that obtainable with the conventional PNPN type photoelectric conversion semiconductor device.

Figure 9:
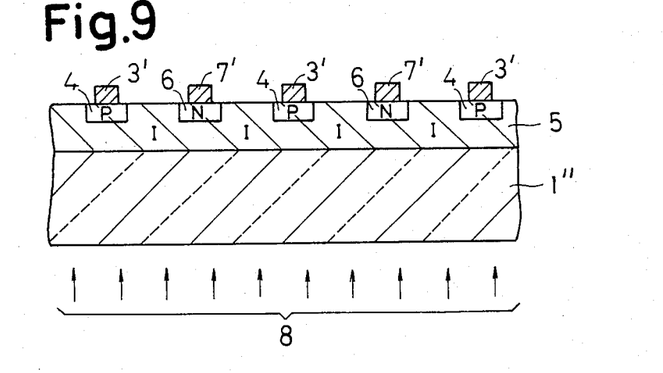

FIG. 9 illustrates a sixth embodiment of the photoelectric conversion semiconductor device according to the present invention. In FIG. 9 the parts corresponding to the parts in FIG. 7 are indicated by the same reference numerals and no detailed description will be repeated in respect of them. The semiconductor region 5 forming the I type region is formed on the transparent substrate 1″. In the semiconductor region 5 the semiconductor regions 4 and 6 constituting comb-shaped P and N type regions, respectively, are formed in an interdigital manner on the opposite side from the substrate 1″. Connected to the semiconductor regions 4 and 6, respectively, are electrodes 3′ and 7′.

The photoelectric conversion semiconductor device of FIG. 9 has a construction equivalent to that of the device of FIG. 7 except that a lateral PIN type structure is employed in place of the vertical one in FIG. 7. Accordingly, there can be obtained across the electrodes 3′ and 7′ an electrical output corresponding to the intensity of the incident 8 in the same manner as in the case of FIG. 7 and the device of this embodiment presents the same excellent photoelectric conversion characteristic as is obtainable with the device of FIG. 7.

In the foregoing the present invention has been described as being applied to photoelectric conversion devices for merely illustrative purposes.

The present invention is equally applicable to a variety of semiconductor devices of the type which are provided with at least first and second semiconductor regions forming therebetween a junction, such as a photo memory, a photo transition, a field effect transistor, a bipolar transistor and so forth. In this case, the first and second semiconductor regions are each formed of the semi-amorphous semiconductor which possesses the aforesaid excellent optical and electrical properties, or the first semiconductor region is formed of the semi-amorphous semiconductor and the second semiconductor region is formed of a crystalline semiconductor such as single crystal or polycrystalline semiconductor, or non-crystalline semiconductor such as amorphous semiconductor. The first and second semiconductor regions may be of different or the same conductivity type and/or energy band gap. Further, they may be of the same conductivity type and of different impurity concentrations.

It will be apparent that many modifications and variations may be effected without departing from the scope of the novel concepts of this invention.

What is claimed is:
1. A semiconductor photoelectric conversion device comprising:
  a substrate having a conductive surface; a semiconductor layer laminate member formed on the substrate; and
  an electrode connected to the semiconductor layer laminate member in a manner to make an ohmic contact therewith;
  wherein the semiconductor layer laminate member is comprised of a P (or N) type first semiconductor layer, an I type second semiconductor layer formed on the first semiconductor layer to define therebetween a PI (or NI) junction, and an N (or P)

type third semiconductor layer formed on the second semiconductor layer to define therebetween an NI (or PI) junction, providing a vertical PIN (or NIP) type structure; and wherein one or more of the first, second and third semiconductor layers are each formed of a mixture of a non-crystalline semiconductor and a microcrystalline semiconductor which is a crystalline semiconductor having a particle size of 5 to 200 Å and is dispersed in the non-crystalline semiconductor with such a distribution of the degree of crystallization that it varies at mean pitches of 5 to 500 Å and 50 Å to 10μ in the direction of the thickness and the surface of the layer(s), respectively, the mixture being doped with dangling bond neutralizers.

2. A semiconductor photoelectric conversion device according to claim 1 wherein the substrate is comprised of a substrate member formed of an insulator and a conductive layer formed on the substrate member.

3. A semiconductor photoelectric conversion device according to claim 1 wherein the substrate is formed of a conductive material.

4. A semiconductor photoelectric conversion device according to claim 1 wherein the first, second and third semiconductor layers of the semiconductor layer laminate member have different energy band gaps.

5. A semiconductor photoelectric conversion device according to claim 1 wherein the first and second semiconductor layers of the semiconductor layer laminate member have different energy band gaps, and wherein the energy band gap of the second semiconductor layer continuously varies from the energy band gap of the first semiconductor layer to the energy band gap of the third semiconductor layer.

6. A semiconductor photoelectric conversion device according to claim 1 wherein the first and third semiconductors are formed of silicon.

7. A semiconductor photoelectric conversion device according to claim 1 wherein the dangling bond neutralizer is hydrogen or halogen and is less than 5 mole percent with regard to the mixture.

* * * * *